United States Patent [19]
Melton et al.

[11] Patent Number: 5,186,383
[45] Date of Patent: Feb. 16, 1993

[54] METHOD FOR FORMING SOLDER BUMP INTERCONNECTIONS TO A SOLDER-PLATED CIRCUIT TRACE

[75] Inventors: Cynthia Melton, Bolingbrook; Carl Raleigh, Cary; Kenneth Cholewczynski, Streamwood; Kevin Moore, Schaumburg, all of Ill.

[73] Assignee: Motorola, Inc., Schaumburg, Ill.

[21] Appl. No.: 770,070

[22] Filed: Oct. 2, 1991

[51] Int. Cl.[5] ........................ B23K 31/02; H05K 3/34
[52] U.S. Cl. .................... 228/180.2; 228/254; 29/840
[58] Field of Search ............... 228/180.2, 254; 29/840

[56] References Cited

U.S. PATENT DOCUMENTS

| | | | |
|---|---|---|---|
| 3,458,925 | 8/1969 | Napier et al. | 228/180.2 |
| 3,488,840 | 1/1970 | Hymes et al. | 29/840 |
| 3,871,014 | 4/1975 | King et al. | 357/67 |
| 3,871,015 | 3/1975 | Lin et al. | 228/180.2 |
| 4,545,610 | 11/1985 | Lakritz et al. | 228/180.2 |
| 4,673,772 | 6/1987 | Satoh et al. | 228/180.2 |
| 4,787,611 | 1/1989 | LoVasco et al. | 228/180.2 |
| 4,914,814 | 4/1990 | Behun et al. | 29/843 |

FOREIGN PATENT DOCUMENTS 63-285996  11/1988  Japan .................... 228/180.2

OTHER PUBLICATIONS

*IBM Technical Disclosure Bulletin*, vol. 29, No. 8, 1987, p.3293 (228/180.2).
Metal Finishing, Guidebook and Directory, published by Metals and Plastics Publications, Inc. (1987), pp.280, 282, 284.

Primary Examiner—Richard K. Seidel
Assistant Examiner—Jeffrey T. Knapp
Attorney, Agent, or Firm—Douglas D. Fekete

[57] ABSTRACT

A method for attaching an integrated circuit component to a printed circuit board by a plurality of solder bump interconnections utilizes a printed circuit board comprising a solder-plated circuit trace. The trace includes terminals, each including a terminal pad and a runner section. A solder plate formed of a first solder alloy is applied to the terminal to extend continuously between the pad and the runner section. Solder bumps are affixed to the component and are formed of second compositionally distinct solder alloy having a melting temperature greater than the first alloy. The component and board are then assembled so that the bumps rest against the solder-plated terminal pads, and heated to a temperature effective to melt the solder plate but not the bump alloy. Upon cooling to resolidify the solder, the solder plate is fused to the bumps to form the interconnections.

10 Claims, 1 Drawing Sheet

U.S. Patent  Feb. 16, 1993  5,186,383
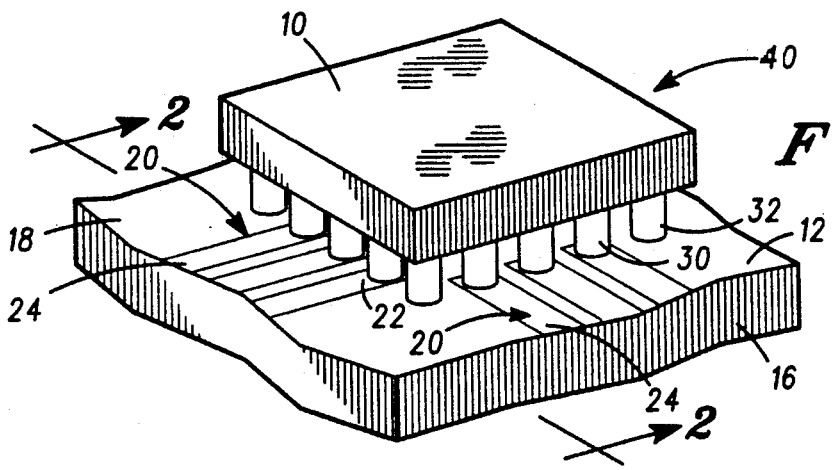
FIG.1
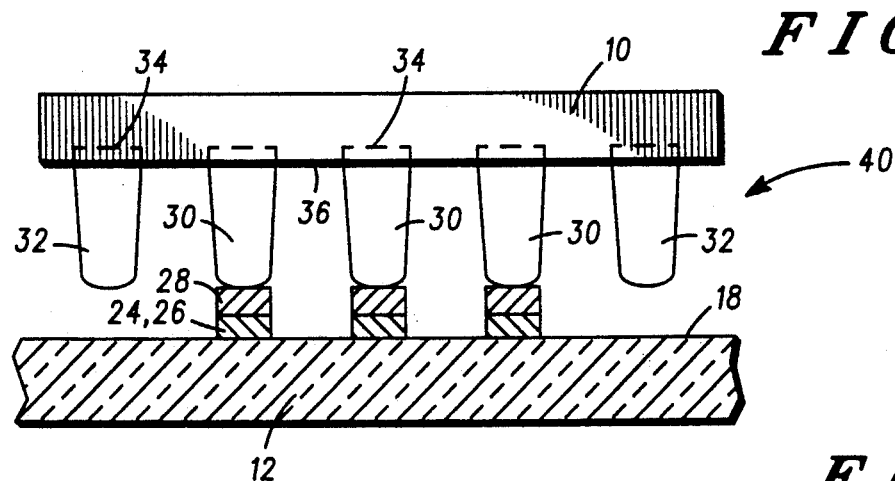
FIG.2
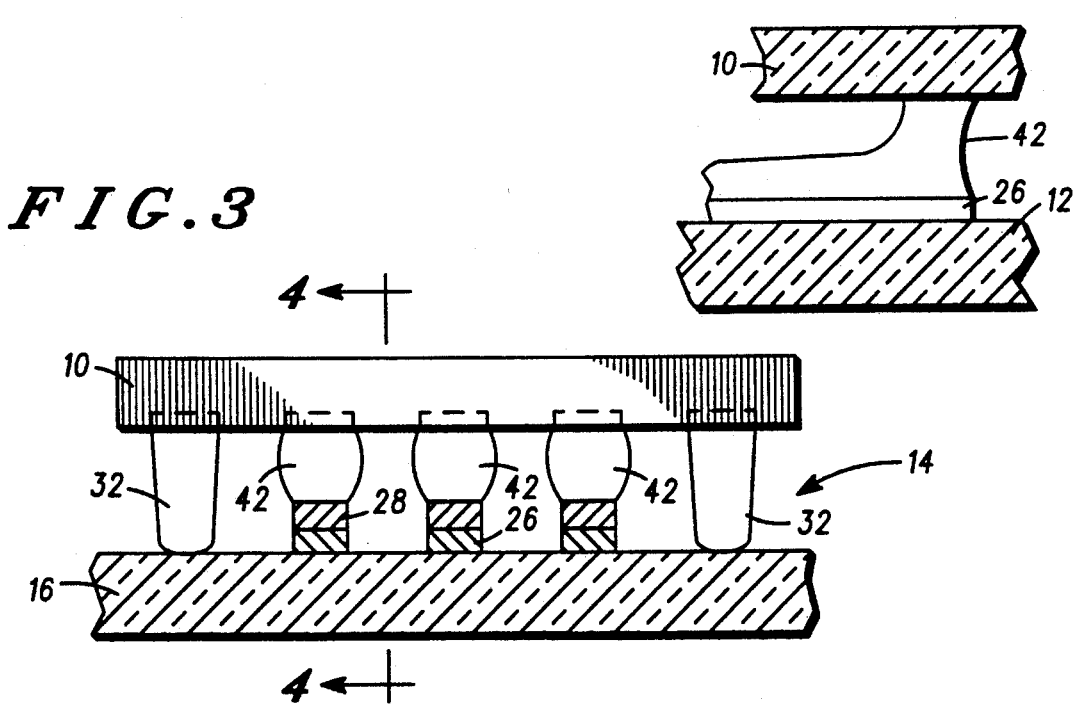
FIG.4
FIG.3

METHOD FOR FORMING SOLDER BUMP INTERCONNECTIONS TO A SOLDER-PLATED CIRCUIT TRACE

BACKGROUND OF THE INVENTION

This invention relates to a method for attaching an integrated circuit component to a printed circuit board by solder bump interconnections. More particularly, this invention relates to a method for forming such interconnections between a circuit trace on the board that carries a continuous solder plate formed of a relatively low melting solder alloy and a solder bump affixed to the component formed of a relatively high melting solder alloy. In one aspect of this invention, the component includes spacer solder bumps in addition to the bumps required for the interconnections, which spacer bumps maintain a spacing between the component and the board to prevent collapse during solder reflow operations to fuse the alloys to complete the interconnection.

In the manufacture of a microelectronic package, it is known to mount an integrated circuit component to a printed circuit board by a plurality of solder bump interconnections that not only physically attach the component, but also electrically connect an electrical circuit of the component to an electrical circuit on the board for conducting electrical signals to and from the component for processing. For this purpose, the board comprises a circuit trace disposed on a dielectric substrate and formed of a solder-wettable metal, typically copper. The trace features terminals, each having a terminal pad adapted for bonding the interconnection, and a runner extending from the pad for electrical communication with remote elements of the circuit. The component, which may be, for example, an integrated circuit die, has a plurality of solderable bond pads arranged in a pattern superposable onto the terminal pads.

To form the interconnection, a solder bump is affixed to each bond pad of the component. This is commonly accomplished by placing a preformed microsphere of solder alloy onto each pad and briefly heating to reflow the alloy to bond the solder to the pad and form the bump. The component is then assembled with the board such that the bumps rest against the terminal pads on the board. The assembly is briefly heated to again reflow the solder alloy and thereby bond the bump to the terminal pad on the board to complete the interconnection.

During reflow onto the board, the molten solder alloy wets the copper trace surface to provide the intimate contact that is essential for forming a strong solder bond. This is accompanied by a tendency for the molten solder to spread along the trace as the result of capillary action and the weight of the component. Thus, it has heretofore been necessary to apply a dam of a material that is not wettable by the molten solder, which is referred to as a solder stop, to confine the molten solder to the terminal pad. By limiting the wettable area of the pad, each bump forms a microdroplet during reflow. The several bumps cooperate to support the component spaced apart from the board. Upon cooling, the microdroplets resolidify to form discrete interconnections. In contrast, in the absence of the solder stop, the molten alloy spreads onto the runner, leading to collapse of the component against the board and failing to produce the desired discrete interconnections. Nevertheless, the solder stop requires additional steps to apply and pattern, which adds to the cost of the package.

Another difficulty arises due to oxidation of the copper trace surface. The molten solder refuses to wet the oxidized surface, and thus does not form the desired bond. In the manufacture of packages that include discrete components, such as individual resistors and capacitors connected to a printed circuit board by wire leads, it is known to electroplate a solder film onto the copper trace to prevent oxidation and thereby provide a plated trace conducive to soldering. However, because the solder plate is applied continuously over the trace, it is not limited to the terminal pad, and thus has not heretofore been suited for bonding bump interconnections.

SUMMARY OF THE INVENTION

In accordance with a preferred embodiment, this invention contemplates a method for attaching an integrated circuit component to a solder-plated circuit trace of a printed circuit board by a plurality of solder bump interconnections, wherein bumps on the component and the plate on the circuit trace are formed of fusible solder alloys characterized by different compositions and having distinct melting temperatures. More particularly, the bump is formed of solder alloy having a melting point greater than the plate. To form the interconnections, the assembly of the bumped component and the printed circuit board is heated at a temperature effective to reflow the plate, but less than the bump melting temperature to limit liquification of the bumps. In one aspect of this invention, a series of dummy bumps is provided that are arranged to avoid the solder-plated trace to act as spacers to produce a predetermined height between the component and the printed circuit board.

In accordance with a preferred embodiment, the method of this invention comprises fabricating a printed circuit board comprising a circuit trace formed of copper or other suitable solder-wettable metal and affixed to a dielectric substrate. The trace features a plurality of terminals. Each terminal includes a terminal pad and a runner section extending from the pad. In accordance with this invention, the trace includes a solder plate applied to the terminals to overly both the terminal pad and the adjacent runner section. The solder plate is composed of a first lead-containing alloy having a relatively low melting temperature.

In preparation for forming the interconnections, a plurality of solder bumps is attached to the component. The bumps are composed of a second lead-containing alloy that is compositionally distinct from the first alloy and has a melting temperature greater than the first alloy melting temperature.

To attach the component to the board, the component is superposed onto the board such that the bumps rest against the solder plate at the terminal pad. This assembly is heated to a temperature greater than the first solder melting temperature and less than the second solder melting temperature. At this temperature, the solder plate melts and fuses to the bumps. The assembly is cooled to resolidify the solder alloy and complete the desired solder bump interconnections.

In one aspect of this invention, the component includes spacer bumps in addition to the bumps for forming interconnections. Thus, the component features a first series of bumps that form the interconnections and are disposed in a pattern superposable onto the board terminal pads, and a second series of bumps disposed to avoid the terminal sections. During heating, the melting of the solder plate forms a liquid phase in contact with the bump, which is accompanied by dissolution of the bump solder at the interface and a lowering of the component toward the board. The second series of bumps engage the board to support the component to prevent collapse against the board. It is found surprisingly that the surface tension forces of the liquid solder are sufficient to maintain a continuous solder bridge between the component bond pad and the board terminal pad despite the tendency of the liquid to be drawn onto the adjacent runner by capillary action. Thus, upon cooling and resolidification, the solder extends continuously between the component and the board to form the interconnection, while the board and component are maintained spaced apart by the desired gap established by the second series of bumps.

Therefore, this invention provides a method for forming a solder bump interconnection to a circuit trace on a printed circuit board that does not require the solder to be confined to the terminal pad, and thus eliminates the costly additional operations that would otherwise be needed to apply and define a solder stop. Furthermore, the method of this invention uses a circuit trace plated with solder metal for protection against oxidation, not only at the terminal pads, but also covering the runner and remote sections of the trace. This is accomplished by providing a solder plate on the trace and a bump on the component formed of different, fusible solder alloys and by reflowing at a temperature below the bump melting point to form the desired interconnections.

DESCRIPTION OF THE DRAWINGS

The present invention will be further illustrated with reference to the accompanying drawings wherein:

FIG. 1 is a perspective view of an assembly of a bumped component superposed onto a solder-plated printed circuit board in preparation for reflow to form solder bump interconnections in accordance with this invention;

FIG. 2 is a cross-sectional view of the assembly in FIG. 1, taken along the line 2—2 and looking in the direction of the arrows;

FIG. 3 is a cross-sectional view, similar to FIG. 2, but shown following solder reflow to form the solder bump interconnections; and FIG. 4 is a cross-section view of the assembly in FIG. 3 taken along line 4—4 and looking in the direction of the arrows, showing a solder bump interconnection formed in accordance with this invention.

DETAILED DESCRIPTION OF THE INVENTION

Referring to FIGS. 1 and 2, in a preferred embodiment, the method of this invention is employed to attach a solder-bumped integrated circuit die 10 to a solder-plated printed circuit board 12 to form a microelectronic package 14, shown in FIG. 3.

Printed circuit board 12 comprises a dielectric substrate 16 of the type referred to as an FR4 card and composed of an epoxy resin and glass fiber laminate. Substrate 16 includes a substantially planar surface region 18 adapted for attachment of component 10. Board 12 further comprises a circuit trace that includes terminals 20. Each terminal 20 includes a terminal pad 22 at the end thereof and a runner section 24 extending from the pad 22. In this embodiment, pads 22 are disposed in a perimeter array pattern for making interconnections about the perimeter of component 10. For purposes of clarity, only a few terminal sections 20 are depicted, although a typical package includes as many as several hundred terminals to make the electrical connections necessary to carry out the intended electrical operations of the component. Also, for clarity, only a minor portion of the board 12 is shown in the figures that includes region 18 that is the site for attaching component 10. While only terminals 20 are depicted, the circuit trace extends onto surrounding regions of board 12 and includes additional features relevant to processing electrical signals. Runners 24 connect the associated pads 22 to the remainder of the circuit for conducting electrical signals to and from pads 22. In this example, pads 22 and runner sections 24 have a uniform width. However, the width may be varied between pad 22 and runner 24, for example, to optimise the pad size for bonding while minimizing the runner width.

Referring particularly to FIG. 2, each terminal 20 comprises two coextensive metal plates 26 and 28. Plate 26 lies immediately adjacent substrate 16 and is formed of metallic copper having high electrical conductivity conducive to conducting electrical signals. Copper plate 26 is coated by a thin solder plate 28 composed of electroplated tin-lead alloy.

Printed circuit board 12 is preferably fabricated from a copper-plated FR4 card of the type that is readily commercially available. The card includes a uniform copper plate that covers surface 18 and provides a basis for forming the electrical circuit trace including terminals 20. The thickness of the copper plate is about 17 microns. To fabricate board 12, a film of photoimagable polymer film is applied to the copper plate and selectively irradiated and developed to form a photoresist mask having openings for exposing the copper plate in a pattern corresponding to the trace including terminals 20. The photoresist mask is about 25 microns thick and forms an electrically insulative coating on regions of the copper plate surrounding the desired trace.

The masked board is immersed in a tin-lead plating solution and cathodically biased to deposit solder alloy onto the exposed copper trace. A suitable plating bath comprises, in water, 56.3 grams per liter tin, added as concentrated stannous fluoroboric solution; 26.3 grams per liter lead, added as concentrated lead fluoroboric solution, 99.8 grams per liter fluoroboric acid; 26.3 grams per liter boric acid and 19.5 grams per liter liquid peptone. The masked board is immersed in the bath at ambient temperature spaced apart from a tin-lead counterelectrode. An electrical potential is applied to the copper plate to negatively bias the copper relative to the counterelectrode and codeposit metallic tin and metallic lead onto the exposed copper surface. One advantage of plating the tin-lead deposit onto the copper plate prior to defining the trace is that the continuous plate facilitates distribution of the plating current to produce a uniform electrodeposit. The resulting plate is composed of an alloy comprising about 40 weight percent lead and the balance tin, and having a melting point of about 183° C. The plate has thickness of about 20 microns. The plate thickness is preferably less than the thickness of the surrounding mask, so that plating is confined to the opening above the trace and does not extend upon the mask surface.

Following plating, the board is immersed in an alkaline solution to strip the photoresist mask, thereby exposing the copper plate about the solder-plated trace.

The board is immersed in an aqueous copper-etching solution containing ammonium persulfate, followed by a water rinse. The etching solution dissolves the exposed copper. However, the tin-lead alloy is resistant to attack by the etching solution and acts as a mask to protect the underlying copper trace. In this manner, the unwanted copper is removed from region 18 to define the solder-plated terminals that include the copper plate coated with the uniform, thin solder plate as depicted in FIG. 2.

In a separate operation, component 10 is fabricated to include a plurality of solder bumps 30 and 32. In this embodiment, component 10 comprises an integrated circuit die, also referred to as semiconductor chip, that includes a circuit having features (not shown) for processing electrical signals conducted to and from the component through the interconnections. Alternately, the component may be a semiconductor chip mounted on a ceramic chip carrier, which carrier is adapted for forming the interconnections. Bumps 30 and 32 are affixed to solder-wettable bond pads 34 formed on a generally planar surface 36 of component 10. To affix the solder bumps, component 20 is positioned with surface 36 facing up. A preformed microball of solder alloy is placed onto each pad 34. The alloy comprises about 5 weight percent tin and the balance substantially lead and has a melting point of about 327° C. The component with the solder microballs is then heated to a temperature above the melting temperature to reflow the solder alloy onto the adjacent pad 34 to form the bumps. Heating to a temperature of about 330° C. for about 45 seconds is suitable for melting the alloy and wetting the pads. The component is then cooled to form solder bumps 30 and 32 that are integrally bonded to the underlying pads.

In this embodiment, the solder bumps 30 and 32 are substantially uniform in size and composition, but are disposed on the component in arrangements corresponding to a first and a second series. The first series comprises solder bumps 30 disposed in a pattern superposable onto terminal pads 22. The second series is composed of bumps 32 located at corner sites of component 10 in a pattern that is not superposable onto terminal sections 20.

Following fabrication of component 10 with the affixed bumps 30 and 32 and printed circuit board 12 having solder-plated terminal sections 20, component 10 and board 12 are arranged in an assembly 40 depicted in FIGS. 1 and 2. Prior to assembly, a mildly activated rosin flux is applied to the bumps to facilitate subsequent soldering operations. Component 10 is arranged with surface 36 facing board region 18 and furthermore with first series bumps 30 resting against solder-plated terminal pads 22. In this assembly, corner bumps 32 immediately overly substrate surface 18 at sites spaced apart from terminal sections 20.

Assembly 40 is then heated at a temperature above the melting point of solder plate 28, but less than the melting point of solder bumps 30 and 32. Preferably, assembly 40 is heated at a temperature of 220° C. for a time of about 45 seconds. During heating, the solder alloy forming plate 28 on terminal section 20 melts and forms a liquid phase in contact with solder bumps 30 on component 10. Upon liquification of plate 28, it is believed that bumps 30 initially sink against copper plate 26 under the weight of component 10. Also, the lead-base alloy of bump 30 in contact with the liquid phase derived from plate 28 commences to dissolve. This leads to further collapse of component 10 toward board 12. Eventually, corner bumps 32, which remain solid at the reflow temperature, engage surface 18 of board 12 and thereby prevent further collapse of component 10. Furthermore, dissolution of the outer portions of bumps 30 into the contacting liquid layer derived from plate 28 is accompanied by wicking of excess liquid from terminal pad 22 onto the adjacent runner section 24, as shown in FIG. 4. Despite this spread of the molten solder, solder nevertheless bridges the gap between the component 10 and board 12. Upon cooling, the resultant solder composition is resolidified to produce interconnections 40 that extend continuously between bond pads 34 and terminals 20.

The resulting microelectronics package 14 comprises component 10 mounted on printed circuit board 12 and connected by a plurality of solder bump interconnections 40, each interconnection extending between a bond pad 34 of component 10 and a terminal pad 22 of board 12. The package features interconnections 40 formed of an integral solder body derived from the fusion of solder bumps 30 and solder plate 28. The product solder body extends continuously between bond pads 34 and terminal pads 22 to physically join component 10 to board 12 and to electrically connect the pads for conducting electrical signals between the circuit trace on board 12 and the circuit of component 10. In addition, the solder plate extends continuously onto runner 24 to protect the underlying trace from oxidation that might interfere with subsequent processing steps or might reduce performance of the package during use. It is a significant feature of this invention that the interconnections 40 are formed without requiring application of a solder stop to limit reflow to the terminal pads, thereby eliminating the steps required to apply and pattern the solder stop and reducing the cost of the package. It is also an advantage of this embodiment that the gap between component surface 36 and board surface 18 is maintained by the corner bumps 32 to prevent component 10 from collapsing against board 12 which would otherwise short the electrical connections. The gap is achieved by spacer bumps 32 affixed concurrent with bumps 30 for the interconnections, so as to avoid additional steps in the manufacturing process. Furthermore, the uniform spacing facilitates subsequent processing, for example, cleaning to remove flux residue and underencapsulation to reinforce the mounting.

In the described embodiment, the solder plate applied to the copper trace is formed of an electroplated alloy comprising about 40 percent lead and the balance tin, whereas the solder bump affixed to the component is formed of an alloy containing about 5 percent tin and the balance lead. Tin and lead form a low-melting eutectic composition composed of about 37 weight percent lead and the balance tin and having a melting point of 183° C. Thus, the plate features a near-eutectic composition, whereas the bump is formed of a substantially lead alloy having a significant higher melting point. Preferably, the solder plate comprises between 35 and 45 weight percent lead, the balance mainly tin, and the bumps are composed of an alloy containing at least 90 weight percent lead. During operation of the package, the interconnections are subjected to stress attributed in a large part to differential thermal expansion of the component relative to the board. In general, it is desired to utilize a high lead solder for the interconnections to form bonds having increased strength to withstand the stresses. However, predominantly lead solders require an elevated reflow temperature at which the epoxy resin forming the board tends to decompose. A still further advantage of the described embodiment is the use of predominantly lead solder in the bumps for optimum bonding to the component, while utilizing near-eutectic alloy having a lower melting point to complete bonding without damage to the board.

In accordance with the method of this invention, reflow to complete the interconnection is carried out at a temperature effective to melt the solder plate on the circuit board, but not melt the bump alloy. In general, the reflow conditions are selected to assure wetting and fusion of the molten plate alloy to the bumps to prevent cold joints that do not produce the desired integral connection between the component and the board trace. On the other hand, it is desired to limit the time and temperature during reflow to avoid excessive dissolution of the bump alloy. For the preferred combination of a near-eutectic plate and a substantially lead bump, reflow is suitably carried out at a temperature between about 200° C. and 220° C. for a time between about 40 and 60 seconds. Formation of the near-eutectic liquid phase adjacent the lead-base bump is accompanied by dissolution of the bump alloy into the liquid phase. While not limited to any particular theory, it is believed that dissolution of the bump alloy is limited to the surface in contact with the plate-derived liquid phase and produces a compositional gradient between a core formed of the original bump alloy and the electroplated composition remote from the interconnection.

While this invention has been described using a preferred combination of solder alloys, it is not limited to that specific combination, but rather may be carried out using any fusible combination of solder alloys wherein the bump alloy is selected to exhibit a melting temperature greater than the plate alloy and reflow is carried out at an intermediate temperature. For example, in an alternate embodiment, the method of this invention is adapted to form solder bump interconnections using a plate formed of a solder alloy containing about 70 weight percent indium and the balance lead and having a melting temperature of about 173° C. The interconnections may be formed either to substantially lead bumps similar to the described embodiment, or to bumps formed of near-eutectic tin-lead alloy. In addition, the solder alloys may contain silver or other minor amounts of other alloys. In selecting alloys for the practice of this invention, it is preferred to utilize alloys having significant lead contents to optimize fusion between the plate and the bump during reflow while avoiding formation of unwanted intermetallic phases that weaken the resulting bond.

In the described embodiment, the component includes the first series of bumps adapted to form the interconnections with the terminal sections on the board and a second series of bumps disposed to avoid the terminal sections and to serve as spacers to prevent collapse of the component against the board. The desired interconnections may be suitably formed in the absence of the spacer bumps by limiting the time for reflow to control dissolution of the bumps. Nevertheless, the spacer bumps are preferred to avoid difficulty due to uneven dissolution of the interconnection bumps and obtain a more uniform spacing. A series of at least four spacer bumps, located, for example, at corners of the component surface, are generally adequate to prevent collapse of the component. While in the described embodiment, the spacer bumps collapsed against the dielectric substrate, in an alternate embodiment, the spacer bumps may collapse against copper pads similar to the trace, but without the solder plating, to increase the height.

In the described embodiment, the terminal section of the circuit trace on the printed circuit board was composed of a terminal pad and an adjacent runner having a substantially uniform width and further carrying a solder plate having a substantially uniform thickness. In an alternate embodiment, the width of the terminal pad relative to the runner may be varied to provide an optimum area for forming the interconnection. In addition, the solder may be applied to the terminal pad to form a bump having height greater than the adjacent runner to thereby provide an increased mass of solder for forming the interconnections. U.S. patent application Ser. No. 740,272, filed Aug. 5, 1991, incorporated herein by reference, describes a method for forming solder-bumped terminals on a printed circuit board from an electroplate that extends between terminal pads and an adjacent runner section, which solder-bumped terminal pads may be suitably employed in combination with higher melting solder bumps in accordance with the method of this invention.

While this invention has been described in terms of certain embodiments thereof, it is not intended that it be limited to the above description but rather only to the extent set forth in the claims that follow.

The embodiments of the invention in which an exclusive property or privilege is claimed are defined as follows.

We claim:

1. A method for forming a microelectronic component package comprising an integrated circuit component attached to a printed circuit board by a plurality of solder bump interconnections, said method comprising fabricating a printed circuit board comprising a solder-wettable metal trace affixed to a dielectric substrate, said trace comprising a plurality of terminals, each said terminal comprising a terminal pad adapted for bonding a said solder bump interconnection and a runner section connected to the pad for conducting electrical signals to and from the interconnection for processing by the component, said trace further comprising a solder plate overlying the terminal and extending continuously from each said pad onto the adjacent runner section, said solder plate composed of a first lead-containing alloy having a melting temperature, attaching a plurality of solder bumps to a generally planar surface of the component, said component bumps being composed of a second lead-containing alloy compositionally distinct from said first alloy and having a melting temperature greater than the first alloy melting temperature, superposing said component onto said board to form an assembly such that said bumps rest against the solder plate at the board terminal pads, heating the assembly to a temperature greater than the first alloy melting temperature and less than the second alloy melting temperature for a time sufficient to melt the solder plate adjacent the bumps, and cooling to resolidify the solder alloy to form a plurality of solder bump interconnections bonding the component to the board.

2. The method of claim 1 wherein the solder plate is formed of a near-eutectic alloy composed of between about 35 and 45 weight percent lead and the balance substantially tin.

3. The method of claim 1 wherein the solder bumps are formed of an alloy containing at least about 90 weight percent lead.

4. A method for forming a microelectronic component package comprising an integrated circuit component attached to a printed circuit board by a plurality of solder bump interconnections, said method comprising fabricating a printed circuit board comprising a solder-wettable metal trace affixed to a dielectric substrate, said trace comprising a plurality of terminals, each said terminal comprising a terminal pad adapted for bonding a said solder bump interconnection and a runner section connected to the pad for conducting electrical signals to and from the interconnection for processing by the component, said trace further comprising a solder plate overlying the terminals so as to extend continuously from each said pad onto the adjacent runner section and composed of a first tin-lead solder alloy having a melting temperature, attaching a plurality of solder bumps to a generally planar surface of the component, said component bumps being composed of a second tin-lead solder alloy compositionally distinct from said first alloy and having a melting temperature greater than the first alloy melting temperature, said solder bumps including a first series disposed in an arrangement superposable onto the board terminal pads and a second series disposed in an arrangement to avoid said terminal pads, superposing said component onto said board to form an assembly such that said first series bumps rest against the solder plate at the board terminal pads and said second series bumps overlie the substrate remote from said pads, heating the assembly to a temperature greater than the first solder alloy melting temperature and less than the second solder alloy melting temperature for a time sufficient to melt the solder plate to form a liquid solder phase in contact with the first series bumps, whereby said first series bumps partially dissolve into the liquid phase to lower said component toward said board, whereupon the second series bumps engage the substrate to support the component spaced apart from the substrate, and cooling to resolidify the solder phase to form a plurality of solder bump interconnections bonding the component to the board.

5. The method of claim 4 wherein the solder plate is formed of a near-eutectic alloy composed of between about 35 and 45 weight percent lead and the balance substantially tin.

6. The method of claim 4 wherein the solder bumps are formed of an alloy containing at least about 90 weight percent lead and the balance substantially tin.

7. The method of claim 5 wherein the solder plate is deposited onto the trace by electroplating.

8. The method of claim 4 wherein the heating is carried out at a temperature between about 200° C. and 220° C. for a time between 40 and 60 seconds.

9. A method for forming a plurality of solder bump interconnections attaching an integrated circuit component to a printed circuit board, said printed circuit board comprising a metallic copper trace affixed to a dielectric substrate, said trace comprising a plurality of terminals, each said terminal comprising a terminal pad adapted for bonding a said solder bump interconnection and a runner section connected to the pad for conducting electrical signals to and from the interconnection for processing by the component, said component comprising a generally planar surface including a plurality of solder-wettable bond pads, said bond pads including a first series disposed in a pattern superposable onto the board terminal pads and a second series including at least four pads disposed in an pattern to overlie said substrate remote from the terminals of the component when said first series is superposed onto the terminal pads, said method comprising applying a copper plate to a generally planar surface of the substrate, applying a polymeric mask onto a region of the copper plate, said mask having openings for exposing said copper plate in a configuraton corresponding to the trace, electroplating a solder plate onto the exposed copper plate, said solder plate being formed of an alloy composed of between about 35 and 45 weight percent lead and the balance substantially tin, removing said mask to expose the copper at the region surrounding the solder plate, treating the copper plate with a copper etching solution to remove the copper from the region and expose the substrate, whereby the solder plate protects the underlying copper to define the trace, attaching a plurality of solder bumps to said component bond pads, said bumps being composed of an alloy composed of at least about 90 weight percent lead and having a melting temperature greater than the solder plate alloy melting temperature, superposing said component onto said board to form an assembly such that solder bumps affixed to said first series pads rest against the solder plate at the board terminal pads and said bumps affixed to the second series bond pads overlie the substrate remote from said terminal pads, heating the assembly to a temperature effective to melt the solder plate but less than the solder bump melting temperature for a time sufficient to melt the solder plate alloy to form a liquid phase that wets the first series solder bumps, said solder bump alloy partially dissolving into the liquid phase to lower the component toward the board, whereby said component is supported on the board by said second series bumps, and cooling to resolidify the solder alloy to form a plurality of solder bump interconnections bonding the component to the board.

10. The method of claim 9 wherein said heating to melt the solder plate alloy is carried out at a temperature between about 200° C. and 220° C. for a time between 40 and 60 seconds.

* * * * *